(12) United States Patent
Niu et al.

(10) Patent No.: US 10,209,557 B2
(45) Date of Patent: Feb. 19, 2019

(54) DISPLAY SUBSTRATE

(71) Applicant: BOE Technology Group Co., Ltd., Beijing (CN)

(72) Inventors: Jing Niu, Beijing (CN); Yonglian Qi, Beijing (CN); Shuang Sun, Beijing (CN); Fangzhen Zhang, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 65 days.

(21) Appl. No.: 15/126,020

(22) PCT Filed: Jan. 29, 2016

(86) PCT No.: PCT/CN2016/072826
§ 371 (c)(1),
(2) Date: Sep. 14, 2016

(87) PCT Pub. No.: WO2017/031951
PCT Pub. Date: Mar. 2, 2017

(65) Prior Publication Data
US 2017/0261806 A1    Sep. 14, 2017

(30) Foreign Application Priority Data
Aug. 25, 2015  (CN) .......................... 2015 1 0527566

(51) Int. Cl.
*G02F 1/1335* (2006.01)
*G02B 5/30* (2006.01)
(Continued)

(52) U.S. Cl.
CPC ..... *G02F 1/133516* (2013.01); *G02B 5/3058* (2013.01); *G02F 1/1368* (2013.01);
(Continued)

(58) Field of Classification Search
CPC .................................................. G02F 1/133516
See application file for complete search history.

(56) References Cited

U.S. PATENT DOCUMENTS 6,147,738 A  *  11/2000  Okamoto .......... G02F 1/133528
                                                            349/122
2008/0284949 A1*  11/2008  Matsumori .......... G02B 5/3016
                                                            349/96
(Continued)

FOREIGN PATENT DOCUMENTS

CN         101231364 A       7/2008
CN         102650823 A       8/2012
(Continued)

OTHER PUBLICATIONS

May 5, 2016—(WO) International Search Report Written Opinion Appn PCT/CN2016/072826 with English Tran.
(Continued)

*Primary Examiner* — Sang V Nguyen
(74) *Attorney, Agent, or Firm* — Banner & Witcoff, Ltd.

(57) ABSTRACT

Disclosed is a display substrate, which includes a base substrate and a polarization layer, wherein the polarization layer includes grid polarizer (GPs) and light-shielding matrixes arranged in a same layer and made from a same material. The display substrate simplifies the production process, reduces the cost and reduces the thickness of a liquid crystal display (LCD) device.

14 Claims, 4 Drawing Sheets

(51) Int. Cl.
    *G02F 1/1362*     (2006.01)
    *G02F 1/1368*     (2006.01)
    *G03F 7/20*     (2006.01)
    *G02F 1/1333*     (2006.01)
    *G03F 7/00*     (2006.01)

(52) U.S. Cl.
    CPC .. *G02F 1/133512* (2013.01); *G02F 1/133528* (2013.01); *G02F 1/133617* (2013.01); *G02F 1/136209* (2013.01); *G03F 7/2043* (2013.01); *G02F 2001/133357* (2013.01); *G02F 2001/133548* (2013.01); *G03F 7/0002* (2013.01); *G03F 7/0007* (2013.01)

(56) References Cited

U.S. PATENT DOCUMENTS

| | | | | |
|---|---|---|---|---|
| 2012/0057106 | A1* | 3/2012 | Park | G02F 1/133528 349/96 |
| 2012/0287506 | A1* | 11/2012 | Yao | G02B 5/201 359/491.01 |
| 2013/0120698 | A1* | 5/2013 | Takakuwa | G02F 1/133512 349/110 |
| 2013/0135589 | A1* | 5/2013 | Curtis | G02B 27/26 353/8 |
| 2014/0099452 | A1* | 4/2014 | Kawanishi | B29C 41/26 428/1.33 |
| 2014/0118656 | A1* | 5/2014 | Jang | G02F 1/133528 349/44 |
| 2015/0323832 | A1* | 11/2015 | Guo | G02F 1/133514 349/61 |
| 2016/0131945 | A1* | 5/2016 | Woo | G02F 1/133536 349/43 |
| 2016/0341860 | A1* | 11/2016 | Nojiri | G02B 5/3033 |
| 2017/0115439 | A1* | 4/2017 | Hasegawa | C09K 11/02 |
| 2017/0305111 | A1* | 10/2017 | Okabayashi | B32B 7/02 |

FOREIGN PATENT DOCUMENTS

| | | | |
|---|---|---|---|
| CN | 102944943 A | 2/2013 | |
| CN | 105182594 A | 12/2015 | |
| JP | 2009-042319 | * 2/2009 | ............. G02B 5/20 |

OTHER PUBLICATIONS

Aug. 29, 2017—(CN) First Office Action Appn 201510527566.4 and English Tran.

* cited by examiner

DISPLAY SUBSTRATE

The application is a U.S. National Phase Entry of International Application No. PCT/CN2016/072826 filed on Jan. 29, 2016, designating the United States of America and claiming priority to Chinese Patent Application No. 201510527566.4 filed on Aug. 25, 2015. The present application claims priority to and the benefit of the above-identified applications and the above-identified applications are incorporated by reference herein in their entirety.

TECHNICAL FIELD

The embodiment of the present invention relates to a display substrate.

BACKGROUND

In the conventional liquid crystal display (LCD), light-shielding matrixes and polarizers are generally formed in two independent layers, as a result, not only the production cost is increased but also the display device is thickened.

Quantum dot materials have been used to manufacture a color filter (CF) substrate in an LCD device. Quantum dot is a semiconductor nanostructure for binding a conduction band electron, a valence band hole and an exciton in three spatial directions. The confinement can arise from electrostatic potential (generated by external electrodes, doping, strain, or impurities), interface of two different semiconductor materials (e.g., in self-assembled quantum dots), surface of semiconductors (e.g., semiconductor nanocrystals), or a combination thereof. Quantum dot is a nanoparticle formed by II-VI or III-V group elements. The particle diameter of the quantum dot is generally ranged from 1 to 10 nm. As electrons and holes are confined by quantum dots, continuous energy band structures become discrete energy band structures with molecular properties which can emit fluorescent light after excitation. Based on quantum effect, the quantum dot can be widely applied in the fields such as solar cells, luminescent devices and optical biomarkers.

In the display field, a white light-emitting diode (LED) backlight and conventional color filters (CFs) are generally matched with each other to form a color display light source which has the problems of low utilization rate, narrow color gamut of display, etc. When the quantum dots are adopted as CF materials, the display color gamut can be effectively improved.

SUMMARY

Embodiments of the present invention provide a display substrate, comprising a base substrate and a polarization layer, wherein the polarization layer comprises grid polarizers (GPs) and light-shielding matrixes arranged in a same layer and made from a same material.

In one embodiment of the present invention, for example, the display substrate is a color filter (CF) substrate; and the CF substrate further includes a quantum dot layer and a planarization layer disposed between the quantum dot layer and the polarization layer.

In one embodiment of the present invention, for example, the display substrate is an array substrate which further includes thin-film transistors (TFTs) arranged in an array.

In one embodiment of the present invention, for example, the GPs and the light-shielding matrixes in the polarization layer are made from a same metallic material.

In one embodiment of the present invention, for example, the metallic material is selected from the group consisting of: Al, Cu, Au, Ag and Cr.

In one embodiment of the present invention, for example, the planarization layer is made from resin materials containing polar bonds.

In one embodiment of the present invention, for example, the polar bonds are selected from the group consisting of: hydroxyl, carboxyl, carbonyl, ether bond, isocyanate group and urethane.

In one embodiment of the present invention, for example, the resin materials containing the polar bonds are selected from the group consisting of: epoxy resins, phenolic resins, urea resins, acrylic resins, polyvinyl alcohol, polyurethane, rubber, vinyl acetate and copolymers thereof, polystyrene and copolymers thereof, organo-silicon compounds and epoxy phenolic resins.

In one embodiment of the present invention, for example, an adhesive layer is disposed between the polarization layer and the planarization layer.

In one embodiment of the present invention, for example, a material of the adhesive layer includes at least one of indium tin oxide (ITO) and indium zinc oxide (IZO).

In one embodiment of the present invention, for example, a material of the quantum dot layer is selected from the group consisting of: CdS, CdSe, CdTe, ZnO, ZnS, ZnSe, ZnTe, GaAs, GaP, GaSb, HgS, HgSe, HgTe, InAs, InP, InSb, AlAs, AlP, CuInS, CuInSe and AlSb.

In one embodiment of the present invention, for example, the display substrate further comprising: spacers, wherein the spacers are arranged on one side of the display substrate opposite to the base substrate.

In one embodiment of the present invention, for example, the quantum dot layer includes a plurality of quantum dot CF units.

Embodiments of the present invention provide a liquid crystal display (LCD) device comprising the above display substrate.

Embodiments of the present invention provide a method for manufacturing a display substrate, comprising: providing a base substrate and depositing a metal film on the base substrate; and processing the metal film to form grid polarizers (GPs) and light-shielding matrixes.

In one embodiment of the present invention, for example, the method comprising: providing the base substrate; forming a patterned quantum dot layer on the base substrate; forming a planarization layer on the patterned quantum dot layer; depositing the metal film on the planarization layer; and processing the metal film to form the GPs and light-shielding matrixes.

In one embodiment of the present invention, for example, in the above method, processing the metal film to form the GPs and the light-shielding matrixes includes: coating photoresist on the metal film; impressing a mask on the photoresist to form a structure corresponding to the GPs and the light-shielding matrixes; demoulding and removing residual photoresist, and exposing the metal film; and etching the metal film and to form the GPs and the light-shielding matrixes.

In one embodiment of the present invention, for example, a material of the metal film is selected from the group consisting of Al, Cu, Au, Ag and Cr.

In one embodiment of the present invention, for example, after forming the planarization layer on the patterned quantum dot layer and before depositing the metal film, further comprising: forming an adhesive layer and depositing the metal film on the adhesive layer.

In one embodiment of the present invention, for example, a material of the adhesive layer is selected from ITO or IZO.

BRIEF DESCRIPTION OF THE DRAWINGS

In order to clearly illustrate the technical solution of the embodiments of the disclosure, the drawings of the embodiments will be briefly described in the following, it is obvious that the described drawings are only related to some embodiments of the disclosure and thus are not limitative of the disclosure.

Figure 1:
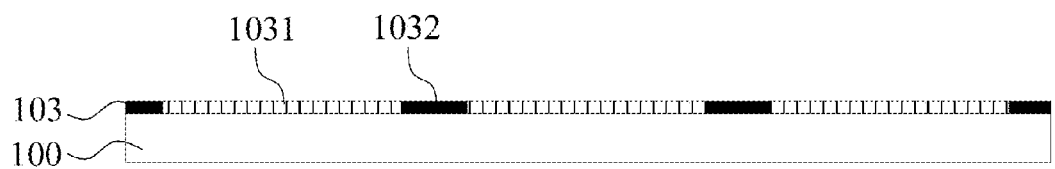
FIG. 1 is a schematic structural view of a display substrate provided by one embodiment of the present invention.

REFERENCE NUMERALS OF THE ACCOMPANYING DRAWINGS 100, 200—base substrate; 101, 201—quantum dot layer; 1011, 2011—patterned red quantum dot unit; 1012, 2012—patterned green quantum dot unit; 1013, 2013—patterned blue quantum dot unit; 102, 202—planarization layer; 103, 203—polarization layer 1031, 2031—grid polarizer (GP); 1032, 2032—light-shielding matrix; 204—adhesive layer; 105—metal film; 106—photoresist layer; 107—mask; 108, 208—spacer; 2—array substrate; 3—opposing substrate (CF substrate); 4—liquid crystal; 5—backlight; 6—sealant; 10—LCD device.

DETAILED DESCRIPTION

In order to make objects, technical details and advantages of the embodiments of the disclosure apparent, the technical solutions of the embodiment will be described in a clearly and fully understandable way in connection with the drawings related to the embodiments of the disclosure. It is obvious that the described embodiments are just a part but not all of the embodiments of the disclosure. Based on the described embodiments herein, those skilled in the art can obtain other embodiment(s), without any inventive work, which should be within the scope of the disclosure.

In conventional LCD devices, light-shielding matrixes and polarizers are generally formed in two independent layers, as a result, not only the production cost is increased but also the display device is thickened.

Quantum dot materials have been adopted to manufacture a CF substrate in an LCD device. However, as fluorescent light emitted by quantum dots after the excitation of incident light is natural light capable of completely running through an upper polarizer, the grayscale cannot be adjusted, so the application of the CF substrate made from the quantum dot materials on the LCD device has the problem of depolarization. Thus, a polarizer must be arranged after backlight runs through liquid crystals and before the quantum dots are excited. However, the process of arranging the polarizer is complex and one more glass substrate must be added, so the cost is increased.

In order to solve the above problems, the embodiment of the present invention provides a display substrate in which the production process is simple and GPs and light-shielding matrixes are integrated in a same layer. When the display substrate is applied in an LCD, the production process is simple and the thickness of the LCD device is reduced. When the display substrate is adopted as a quantum dot CF substrate, the color gamut can be effectively improved and meanwhile the problem of depolarization of the quantum dots can be solved.

Detailed description will be given below to the embodiments of the present invention with reference to the accompanying drawings.

As illustrated in FIG. 1, the embodiment of the present invention provides a display substrate, which comprises a base substrate 100 and a polarization layer 103, wherein the polarization layer 103 includes GPs 1031 and light-shielding matrixes 1032 which are arranged in a same layer and integrally formed.

In the display substrate provided by the embodiment of the present invention, because the GPs and the light-shielding matrixes are integrated in the same layer, not only the production process is simplified but also the thickness of the LCD device is reduced.

Figure 2:
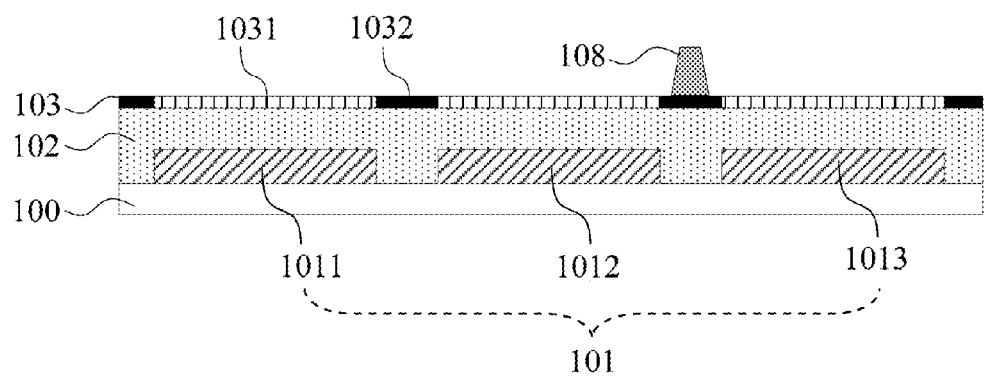
FIG. 2 is a schematic structural view of a display substrate provided by another embodiment of the present invention.

As illustrated in FIG. 2, the embodiment of the present invention provides a display substrate, which comprises a base substrate 100, a quantum dot layer 101, a polarization layer 103, a planarization layer 102 disposed between the quantum dot layer 101 and the polarization layer 103, and spacers 108 disposed on one side of the polarization layer 103 away from the substrate 100, wherein the polarization layer 103 includes GPs 1031 and light-shielding matrixes 1032 which are arranged in a same layer and integrally formed.

The GPs 1031 and the light-shielding matrixes 1032 in the polarization layer 103, for instance, may be made from a same material. For instance, the GPs 1031 and the light-shielding matrixes 1032 in the polarization layer 103 may be made from a same metallic material.

The metallic material may be a metallic material commonly used in the field, e.g., Al, Cu, Au, Ag, Cr or an alloy of the metals.

The adhesion between the polarization layer 103 made from metallic materials and the planarization layer 102 made from, e.g., polymer materials, must be considered in applications. If the adhesion between the polarization layer 103 and the planarization layer 102 is not enough, the breaking of the polarization layer 103 may happen during application. Thus, in order to increase the adhesion between the polarization layer 103 and the planarization layer 102, the planarization layer 103 may be made from resins containing an amount of polar bonds. The polar bonds, for instance, include hydroxyl, carboxyl, carbonyl, ether bond, isocyanate group and urethane. For instance, the resin materials containing more polar bonds include epoxy resins, phenolic resins, urea resins, acrylic resins, polyvinyl alcohol, polyurethane, rubber, vinyl acetate and copolymers thereof, polystyrene and copolymers thereof, organo-silicon compounds and epoxy phenolic resins. Taking urethane resin materials as an example, surfaces of metallic materials have large tension, belong to high-energy surfaces, and generally contain adsorbed water, hydroxyl group and other polar groups; the urethane resin materials may react with active sites such as adsorbed water and hydroxyl group to form covalent bonds; meanwhile, type-2 chemical bonds can also be formed by polar groups such as carbamate and substituted urea in the urethane resin materials and polar groups on the surfaces of the metallic materials; and in addition, coordinate bonds can also be formed by the metallic materials and benzene rings in aromatic polyurethane. Due to the formation of the chemical bonds or the coordinate bonds, effective connection is formed between the polarization layer 103 and the planarization layer 102, so that the adhesion between the polarization layer 103 and the planarization layer 102 can be enhanced.

A material of the quantum dot layer 101 may be selected from quantum dot materials commonly used in the field, for instance, may be one or more selected from the following materials: CdS, CdSe, CdTe, ZnO, ZnS, ZnSe, ZnTe, GaAs, GaP, GaSb, HgS, HgSe, HgTe, InAs, InP, InSb, AlAs, AlP, CuInS, CuInSe and AlSb. The emission spectrum of quantum dots may be controlled by the size of the quantum dots, namely the quantum dots may emit light of different colors in different sizes. Of course, the material of the quantum dots includes but not limited to the above enumerated several materials. Other materials which are the same with or similar to the above substance may also be applicable. Taking ZnS quantum dots as an example, the size of quantum dots for emitting red light generally ranges from 9 nm to 10 nm; the size of quantum dots for emitting yellow light is about 8 nm; and the size of quantum dots for emitting green light is about 7 nm.

A pattern of the quantum dot layer 101 may be set according to actual demands. For instance, the quantum dot layer 101 may include patterned red quantum dot units 1011, patterned green quantum dot units 1012 and patterned blue quantum dot units 1013. Discrete red subpixels, green subpixels and blue subpixels are formed by the patterned red quantum dot units 1011, the patterned green quantum dot units 1012 and the patterned blue quantum dot units 1013. Of course, the quantum dot layer 101 may also include patterned quantum dot units of other colors, e.g., patterned yellow quantum dot units.

In the embodiment of the present invention, as the polarization layer 103 includes GPs 1031 and light-shielding matrixes 1032 which are arranged in the same layer and integrally formed, a polarizer that is arranged after backlight runs through liquid crystals and before exciting the quantum dots can be omitted, and the problem of depolarization when the display substrate is applied to the LCD can be solved. Therefore, the complex step of arranging the polarizer is omitted, so the production process is simplified. Moreover, no glass substrate is required to be arranged, and the cost is reduced.

Another means of increasing the adhesion between the polarization layer and the planarization layer is to further arrange an adhesive layer between the polarization layer and the planarization layer.

Figure 3:
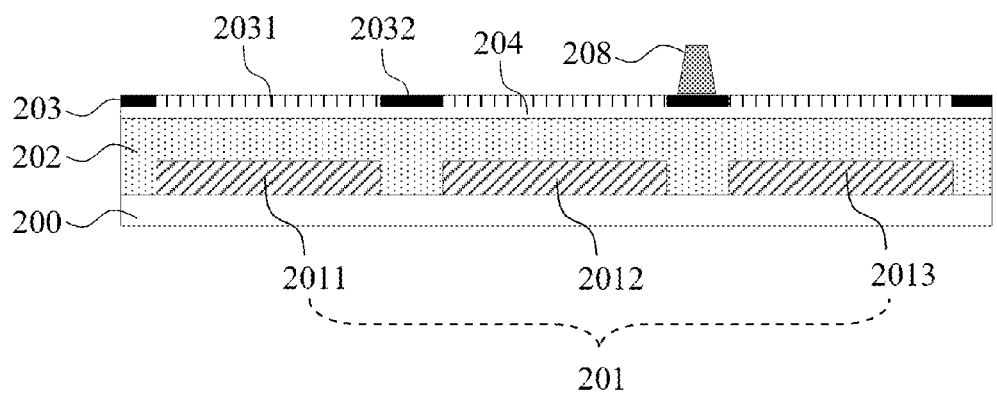
FIG. 3 is a schematic structural view of a display substrate provided by still another embodiment of the present invention.

As illustrated in FIG. 3, the display substrate comprises a base substrate 200, a quantum dot layer 201, a polarization layer 203, a planarization layer 202 disposed between the quantum dot layer 201 and the polarization layer 203, and spacers 208 disposed on one side of the polarization layer 203 away from the substrate 200, wherein the polarization layer 203 includes GPs 2031 and light-shielding matrixes 2032 which are arranged in a same layer and integrally formed. The contents that have been described in the above embodiment would not be repeated here. An adhesive layer 204 is further disposed between the polarization layer 203 and the planarization layer 202. The adhesive layer 204 is generally made from inorganic materials, e.g., ITO and IZO. The adhesive layer 204 made from the above materials may simultaneously provide enough adhesion for the polarization layer 203 made from metallic materials and the planarization layer 202 made from polymer materials, so the planarization layer 202 may not adopt specified resin materials and any materials of the planarization layer commonly used in the present field satisfy the requirement.

As illustrated in FIGS. 4(a) to 4(f), the embodiment of the present invention further provides a method for manufacturing a display substrate.

Figure 4:
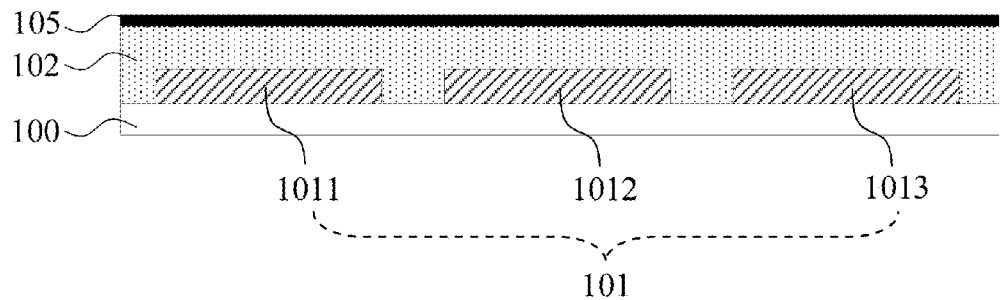
FIGS. 4(a) to 4(f) are schematic diagrams of a method for manufacturing a display substrate provided by one embodiment of the present invention.
Figure 4:
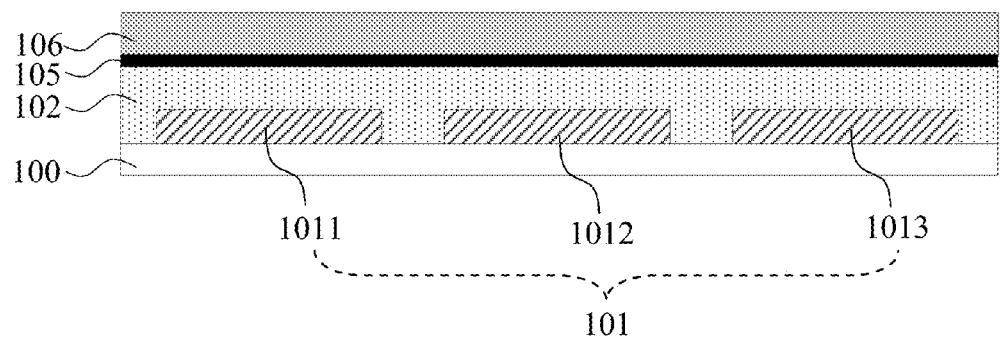
Figure 4:
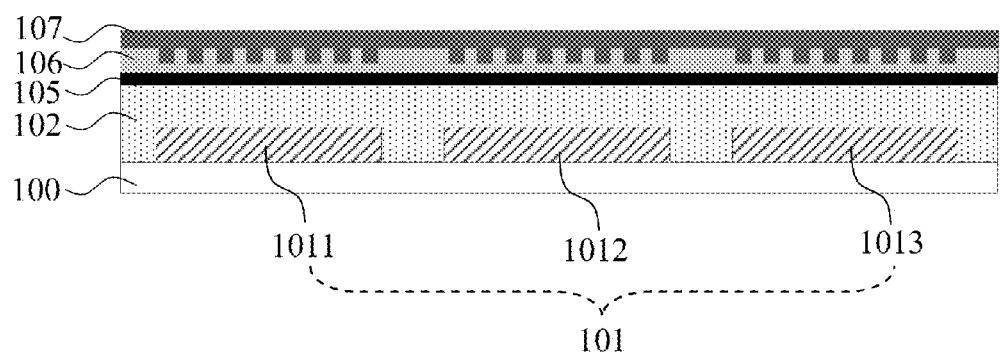
Figure 4:
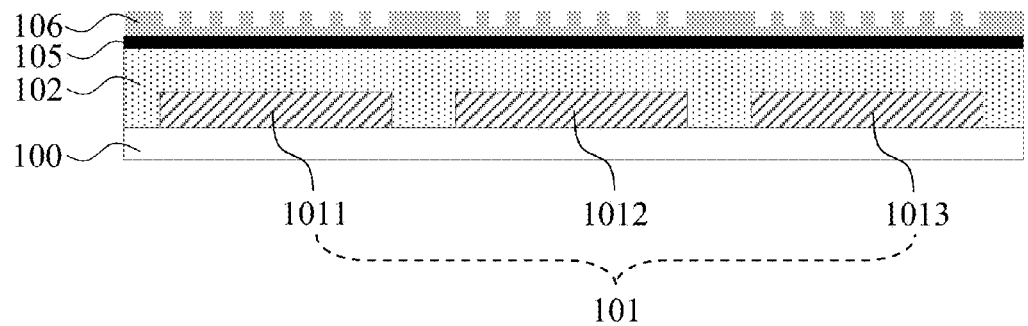
Figure 4:
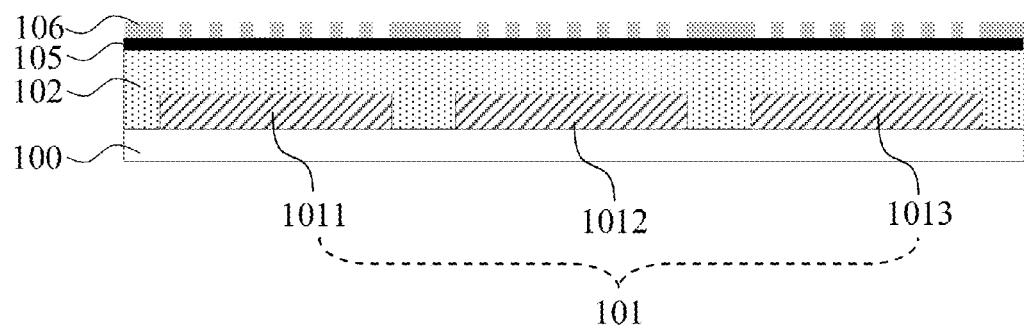
Figure 4:
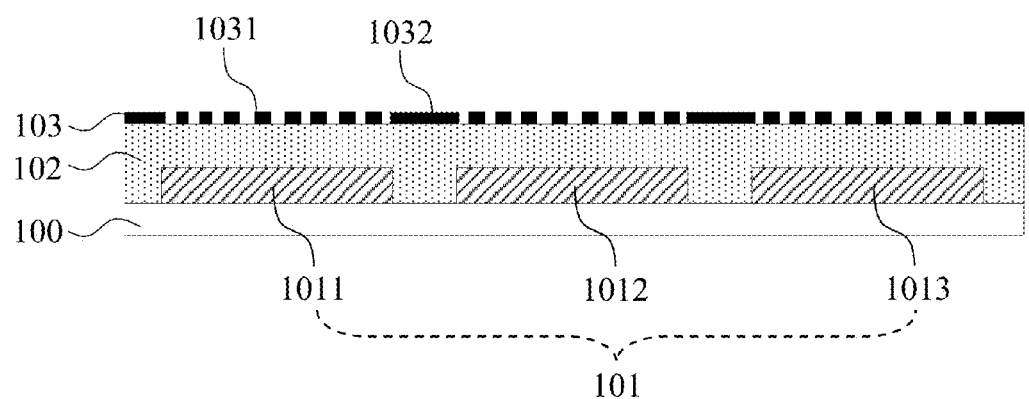

As illustrated in FIG. 4(a), a quantum dot layer 101 is formed on a substrate 100, and a planarization layer 102 is formed on the quantum dot layer 101. The quantum dot layer 101 may include discrete patterned quantum dot units of different colors. As illustrated in FIG. 4(a), the quantum dot layer 101 is formed by 3 discrete patterned quantum dot units 1011, 1012 and 1013. The 3 patterned quantum dot units can emit different light under the excitation of backlight. For instance, the pattern unit 1011 emits red light; the pattern unit 1012 emits green light; and the pattern unit 1013 emits blue light. Thus, full color display can be achieved. The method for forming the quantum dot layer 101 and the planarization layer 102 may adopt the method commonly used in the present field, e.g., coating-exposure-development. No further description will be given here. Subsequently, a metal film 105 is deposited on the planarization layer 102. A material of the metal film 105 may be a metallic material commonly used in the field, e.g., Al, Cu, Au, Ag, Cr or an alloy of the above metals.

As illustrated in FIG. 4(b), a photoresist layer 106 is formed by coating photoresist on the metal film 105. Any conventional photoresist for etching metal in the present field may be used. The photoresist adopted in the present embodiment is polymethyl methacrylate (PMMA).

As illustrated in FIG. 4(c), for instance, the photoresist layer 106 is heated or subjected to UV-irradiation and softened, and a mask 107 is impressed into the photoresist layer 106 to form a structure corresponding to the GPs and the light-shielding matrixes. The manufacturing method of the mask 107, for instance, may include: forming a structure corresponding to the GPs and the light-shielding matrixes on the base substrate such as $SiO_2$ or Si substrate by electron-beam-direct-writing technology.

As illustrated in FIG. 4(d), the mask 107 is removed and the photoresist layer 106 on which the structure corresponding to the GPs and the light-shielding matrices is impressed is retained.

As illustrated in FIG. 4(e), residual photoresist is removed and the metal film 105 is exposed.

As illustrated in FIG. 4(f), the metal film is etched and cleaned, and the GPs 1031 are formed. The metal film 105 becomes the polarization layer 103 including the GPs 1031 and the light-shielding matrixes 1032 which are integrated.

In the embodiment of the present invention, the GPs 1031 and the light-shielding matrixes 1032 are integrated on the polarization layer 103 by nano-printing technology, so one patterning process of the light-shielding matrixes is reduced, and hence the production process is simplified and the cost is reduced. Meanwhile, the polarization layer 103 on which the GPs 1031 and the light-shielding matrixes 1032 are integrated can solve the problem of depolarization of quantum dots, and a polarizer that is arranged after backlight runs through liquid crystals and before exciting the quantum dots can be omitted, so that the structure of luminescent devices can be simplified and the cost can be further reduced.

The method for manufacturing a display substrate in which an adhesive layer is further disposed between the polarization layer and the planarization layer is basically the same with the above method, except that after forming the planarization layer and before depositing the metal film, the method further comprising forming the adhesive layer on the planarization layer.

Figure 5:
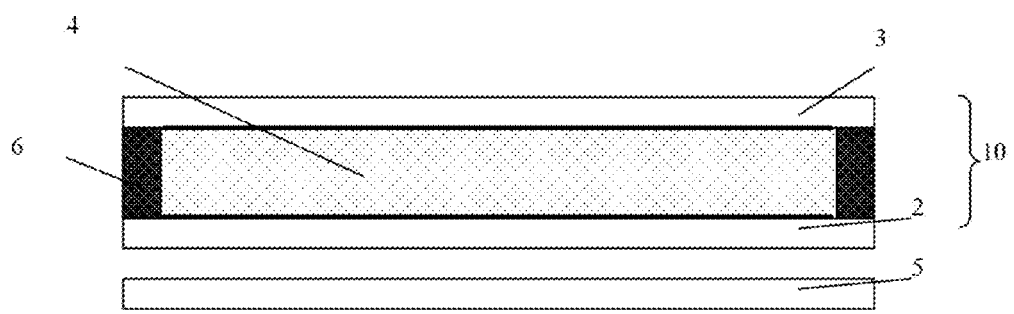
FIG. 5 is a schematic structural view of an LCD device provided by one embodiment of the present invention.

Another embodiment of the present invention provides an LCD device. As illustrated in FIG. 5, the LCD device 10 comprises an array substrate 2 and an automatic opposing substrate 3 arranged opposite to the array substrate 2. The array substrate 2 and the opposing substrate 3 are arranged opposite to each other to form a liquid crystal cell and sealed by a sealant 6, and liquid crystal 4 are filled in the liquid crystal cell. The opposing substrate 3 is a CF substrate as described above. The array substrate 2 includes an array of pixel units. A pixel electrode of each pixel unit is configured to apply an electric field to control the rotation degree of liquid crystal, so as to achieve display. The LCD device 10 further comprises a backlight 5 which is configured to provide backlight for the array substrate. Light emitted by the backlight 5 enters the liquid crystal cell from one side of the array substrate 2 and emits out from one side of the opposing substrate (CF substrate) 3.

The LCD device, for instance, may be any product or component with display function such as an LCD panel, e-paper, a mobile phone, a tablet PC, a TV, a display, a notebook computer, a digital picture frame and a navigator.

What are described above is related to the illustrative embodiments of the disclosure only and not limitative to the scope of the disclosure; the scopes of the disclosure are defined by the claims.

The present application claims the priority of the Chinese Patent Application No. 201510527566.4 filed on Aug. 25, 2015, which is incorporated herein by reference as part of the disclosure of the present application.

What is claimed is:

1. A display substrate, comprising a base substrate and a polarization layer, wherein the polarization layer comprises grid polarizers (GPs) and light-shielding matrixes arranged in a same layer and made from a same material, wherein the display substrate is a color filter (CF) substrate, wherein the CF substrate further comprises:
    a quantum dot layer;
    a planarization layer disposed between the quantum dot layer and the polarization layer; and
    an adhesive layer disposed between the polarization layer and the planarization layer, wherein a material of the adhesive layer consists of at least one of indium tin oxide (ITO) and indium zinc oxide (IZO), and wherein the adhesive layer is in direct contact with the polarization layer and the planarization layer.

2. The display substrate according to claim 1, wherein the display substrate is an array substrate, and the array substrate further comprises thin-film transistors (TFTs) arranged in an array.

3. The display substrate according to claim 1, wherein the GPs and the light-shielding matrixes in the polarization layer are made from a same metallic material.

4. The display substrate according to claim 3, wherein the metallic material is any one selected from the group consisting of: Al, Cu, Au, Ag and Cr.

5. The display substrate according to claim 1, wherein the planarization layer is made from a resin material containing polar bonds.

6. The display substrate according to claim 5, wherein the polar bonds are selected from the group consisting of: hydroxyls, carboxyls, carbonyls, ether bonds, isocyanate groups and urethanes.

7. The display substrate according to claim 6, wherein the resin material containing the polar bonds is any one selected from the group consisting of: epoxy resins, phenolic resins, urea resins, acrylic resins, polyvinyl alcohol, polyurethane, rubber, vinyl acetate and copolymers thereof, polystyrene and copolymers thereof, organo-silicon compounds and epoxy phenolic resins.

8. The display substrate according to claim 1, wherein a material of the quantum dot layer is any one selected from the group consisting of: CdS, CdSe, CdTe, ZnO, ZnS, ZnSe, ZnTe, GaAs, GaP, GaSb, HgS, HgSe, HgTe, InAs, InP, InSb, AlAs, AlP, CuInS, CuInSe and AlSb.

9. The display substrate according to claim 1, further comprising: spacers, wherein the spacers are arranged on one side of the display substrate opposite to the base substrate.

10. The display substrate according to claim 1, wherein the quantum dot layer includes a plurality of quantum dot CF units.

11. A liquid crystal display (LCD) device, comprising the display substrate according to claim 1.

12. A method for manufacturing a display substrate, comprising:
    forming a patterned quantum dot layer on a base substrate;
    forming a planarization layer on the patterned quantum dot layer;
    forming an adhesive layer and depositing a metal film on the adhesive layer; and
    processing the metal film to form grid polarizers (GPs) and light-shielding matrixes, wherein a material of the adhesive layer consists of at least one of indium tin oxide (ITO) and indium zinc oxide (IZO), and wherein the adhesive layer is in direct contact with a polarization layer and the planarization layer.

13. The method according to claim 12, wherein processing the metal film to form the GPs and the light-shielding matrixes includes:
    coating photoresist on the metal film;
    impressing a mask on the photoresist to form a structure corresponding to the GPs and the light-shielding matrixes;
    demoulding and removing residual photoresist, and exposing the metal film; and
    etching the metal film to form the GPs and the light-shielding matrixes.

14. The method according to claim 12, wherein a material of the metal film is selected from the group consisting of Al, Cu, Au, Ag and Cr.

* * * * *